United States Patent
Hachisuka et al.

(10) Patent No.: US 7,417,442 B2
(45) Date of Patent: Aug. 26, 2008

(54) METHOD AND APPARATUS FOR TESTING TUNNEL MAGNETORESISTIVE EFFECT ELEMENT, MANUFACTURING METHOD OF TUNNEL MAGNETORESISTIVE EFFECT ELEMENT AND TUNNEL MAGNETORESISTIVE EFFECT ELEMENT

(75) Inventors: Nozomu Hachisuka, Tokyo (JP); Kenji Inage, Tokyo (JP); Norio Takahashi, Tokyo (JP); Tatsushi Shimizu, Shatin (CN); Pak Kin Wong, Shatin (CN)

(73) Assignees: TDK Corporation, Chuo-Ku, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 574 days.

(21) Appl. No.: 11/130,258

(22) Filed: May 17, 2005

(65) Prior Publication Data

US 2006/0023333 A1    Feb. 2, 2006

(30) Foreign Application Priority Data

Jul. 28, 2004  (JP) .............................. 2004-220247
Mar. 22, 2005  (JP) .............................. 2005-081768

(51) Int. Cl.
  *G01R 27/08*  (2006.01)
  *H01L 21/66*  (2006.01)

(52) U.S. Cl. ....................... 324/691; 324/719; 324/230; 360/324.2; 338/32 R

(58) Field of Classification Search ................ 324/691, 324/719, 230; 338/32 R; 360/324.2
See application file for complete search history.

(56) References Cited

U.S. PATENT DOCUMENTS

| | | | | |
|---|---|---|---|---|
| 3,256,483 | A  * | 6/1966  | Broadbent  | ................... 324/693 |
| 6,067,200 | A  * | 5/2000  | Ohba et al.  | .................... 360/66 |
| 6,473,257 | B1   | 10/2002 | Shimazawa et al. | |
| 6,927,569 | B2 * | 8/2005  | Worledge et al. | ........... 324/230 |
| 2002/0154540 | A1* | 10/2002 | Sekiguchi et al. | ........... 365/171 |

FOREIGN PATENT DOCUMENTS

JP    2004-062954    2/2004

* cited by examiner

*Primary Examiner*—Vincent Q Nguyen
(74) *Attorney, Agent, or Firm*—Frommer Lawrence & Haug

(57) ABSTRACT

A method for testing a TMR element includes a step of measuring a plurality of resistances of the TMR element by feeding a plurality of sense currents with different current values each other through the TMR element, a step of calculating a ratio of change in resistance from the measured plurality of resistances of the TMR element, and a step of evaluating the TMR element using the calculated ratio of change in resistance.

54 Claims, 10 Drawing Sheets

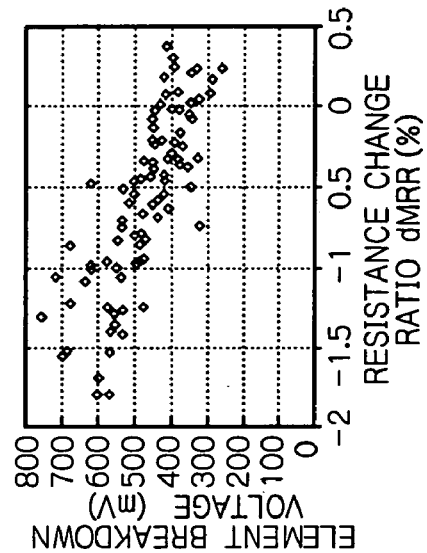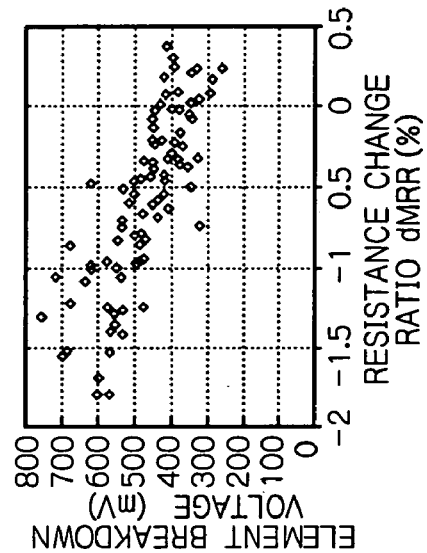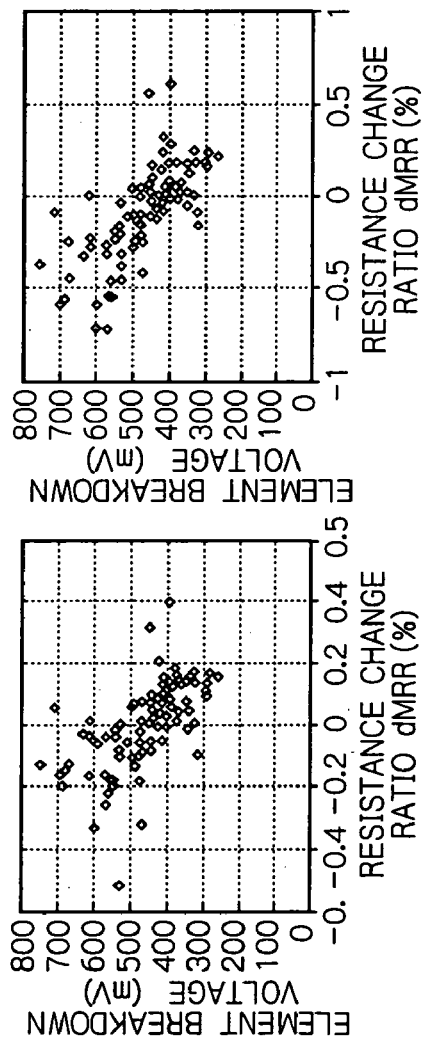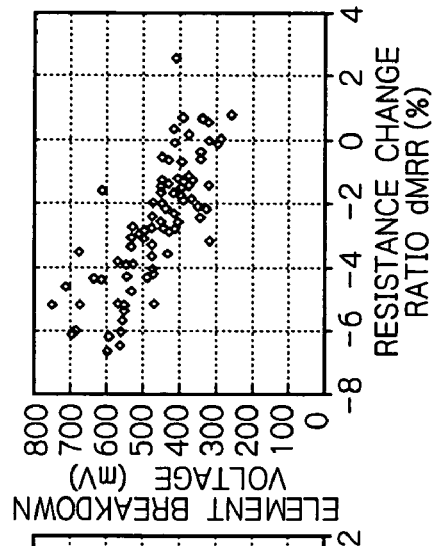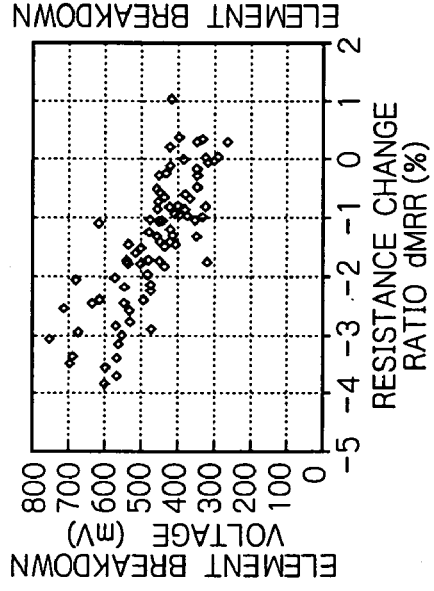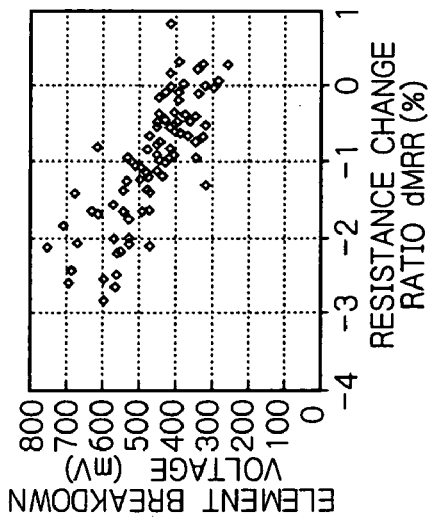

METHOD AND APPARATUS FOR TESTING TUNNEL MAGNETORESISTIVE EFFECT ELEMENT, MANUFACTURING METHOD OF TUNNEL MAGNETORESISTIVE EFFECT ELEMENT AND TUNNEL MAGNETORESISTIVE EFFECT ELEMENT

PRIORITY CLAIM

This application claims priority from Japanese patent application No. 2004-220247, filed on Jul. 28, 2004 and Japanese patent application No. 2005-081768, filed on Mar. 22, 2005, which are incorporated herein by reference.

BACKGROUND OF THE INVENTION

1. Field of the Invention

The present invention relates to a method and apparatus for testing a tunnel magnetoresistive effect (TMR) element such as a TMR read head element using the tunnel magnetoresistive effect or a magnetoresistive random access memory (MRAM) cell, to a manufacturing method of a TMR element, and to a TMR element.

2. Description of the Related Art

An evaluation test is in general performed for determining whether or not a thin-film magnetic head with a TMR read head element is a non-defective product, during or after manufacturing the magnetic head. This evaluation test includes a reliability test for confirming that a breakdown voltage of the MR head element is sufficiently high to withstand an extended period of use.

U.S. Pat. No. 6,473,257 discloses a testing method for confirming a reliability of a TMR read head element without damaging or breaking the TMR read head element. In this testing method, a performance of the TMR read head element such as its electromagnetic conversion performance is measured by using a test current with a predetermined value. The value of the test current value is determined by measuring a resistance of the TMR read head element when a predetermined initial current is flowing there through, or determined by repeatedly measuring a modified current when a reference voltage is applied to the TMR read head element and by measuring a resistance of the TMR read head element when the finally measured modified current is flowing there through.

However, this testing method disclosed in U.S. Pat. No. 6,473,257 requires a performance test of the TMR read head element such as an electromagnetic conversion performance test of the TMR read head element, and thus requires a great deal of expense in manpower and in time for confirming a reliability.

BRIEF SUMMARY OF THE INVENTION

It is therefore an object of the present invention to provide a method and apparatus for testing a TMR element, a manufacturing method of a TMR element, and a TMR element, whereby a reliability of the TMR element can be quickly and easily confirmed without failing.

According to the present invention, a method for testing a TMR element includes a step of measuring a plurality of resistances of the TMR element by feeding a plurality of sense currents with different current values each other through the TMR element, a step of calculating a ratio of change in resistance from the measured plurality of resistances of the TMR element, and a step of evaluating the TMR element using the calculated ratio of change in resistance.

In this case, it is preferred that the measuring step includes feeding a plurality of discontinuous sense currents with different current values each other through the TMR element. Feeding of a plurality of discontinuous sense currents means that feeding of one sense current is stopped after the feeding thereof, and then another sense current is fed.

It is also preferred that the measuring step includes measuring two resistances of the TMR element by feeding two sense currents with different current values each other through the TMR element, and that the calculating step includes calculating a ratio of change in resistance based upon the measured two resistances of the TMR element.

According to the present invention, also, a method for testing a TMR element includes a step of measuring a first resistance of the TMR element by feeding a first sense current with a first current value through the TMR element, and a second resistance of the TMR element by feeding a second sense current with a second current value of which absolute value is greater than that of the first current value through the TMR element, a step of calculating a ratio of change in resistance from the measured first and second resistances of the TMR element, and a step of evaluating the TMR element using the calculated ratio of change in resistance.

Sense currents with different current values are fed to the TMR element and the resistances of the TMR element at the different current values are measured to calculate a ratio of change in resistance. The calculated ratio of change in resistance is used for evaluating the TMR element. This measurement, calculation and evaluation are performed for every TMR element. Element breakdown voltages of TMR elements having small ratios of change in resistance are lower than that of TMR elements having large ratios of change in resistance. Therefore, measurement of resistances by feeding sense currents with different current values and calculation of a ratio of change in resistance from thus measured resistances allow confirmation of reliability of the TMR element. Also, this evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production.

It is preferred that the measuring step includes feeding a second sense current that is discontinuous to the first sense current through the TMR element. The second sense current is discontinuous to the first sense current means that feeding of the first sense current is stopped after the feeding thereof, and then the second sense current is fed.

It is also preferred that the calculating step includes calculating the ratio of change in resistance from a difference between the measured first and second resistances.

It is further preferred that the calculating step includes calculating the ratio of change in resistance from an expression of $(R_2-R_1)/R_1 \times 100(\%)$, where the first resistance is indicated by $R_1$ and the second resistance is indicated by $R_2$.

It is also preferred that the evaluating step includes evaluating the TMR element as a non-defective product when the calculated ratio of change in resistance $(R_2-R_1)/R_1 \times 100(\%)$ is less than a predetermined threshold. If the TMR element has a tunnel barrier layer made of an oxide of aluminum (Al) such as for example $Al_2O_3$, and the measuring step includes feeding a first sense current of 0.1 mA through the TMR element and feeding a second sense current of 0.4 mA through the TMR element, it is preferred that the predetermined threshold is $-0.8(\%)$. If the tunnel barrier layer of the TMR element is made of a material other than the oxide of Al, it is possible to similarly evaluate the TMR element by correspondingly determining current values of the first and second sense currents and a threshold value of the resistance change ratio.

It is preferred that the measuring step includes applying an external DC magnetic field in a predetermined direction to the TMR element so that the measuring step is performed under the applied external DC magnetic field.

It is preferred that the TMR element is a TMR head element or an MRAM cell.

According to the present invention, further, an apparatus for testing a TMR element includes a unit for measuring a first resistance of the TMR element by feeding a first sense current with a first current value through the TMR element, and a second resistance of the TMR element by feeding a second sense current with a second current value of which absolute value is greater than that of the first current value through the TMR element, a unit for calculating a ratio of change in resistance from the measured first and second resistances of the TMR element, and a unit for evaluating the TMR element using the calculated ratio of change in resistance.

Measurement of resistances by feeding sense currents with different current values and calculation of a ratio of change in resistance from thus measured resistances allow confirmation of reliability of the TMR element. Also, the evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production.

It is preferred that the measuring unit includes a unit for feeding a second sense current that is discontinuous to the first sense current through the TMR element. The second sense current is discontinuous to the first sense current means that feeding of the first sense current is stopped after the feeding thereof, and then the second sense current is fed.

It is also preferred that the calculating unit includes a unit for calculating the ratio of change in resistance from a difference between the measured first and second resistances.

It is further preferred that the calculating unit includes a unit for calculating the ratio of change in resistance from an expression of $(R_2-R_1)/R_1\times 100(\%)$, where the first resistance is indicated by $R_1$ and the second resistance is indicated by $R_2$.

It is also preferred that the evaluating unit includes a unit for evaluating the TMR element as a non-defective product when the calculated ratio of change in resistance $(R_2-R_1)/R_1\times 100(\%)$ is less than a predetermined threshold. If the TMR element has a tunnel barrier layer made of an oxide of aluminum (Al) such as for example $Al_2O_3$, and the measuring unit includes a unit for feeding a first sense current of 0.1 mA through the TMR element, and a unit for feeding a second sense current of 0.4 mA through the TMR element, it is preferred that the predetermined threshold is $-0.8(\%)$. If the tunnel barrier layer of the TMR element is made of a material other than the oxide of Al, it is possible to similarly evaluate the TMR element by correspondingly determining current values of the first and second sense currents and a threshold value of the resistance change ratio.

It is preferred that the measuring unit includes a unit for applying an external DC magnetic field in a predetermined direction to the TMR element so that the measurement is performed under the applied external DC magnetic field.

It is preferred that the TMR element is a TMR head element or an MRAM cell.

According to the present invention, a manufacturing method of a TMR element includes a wafer process for forming many thin-film TMR elements on a wafer, a cut process for cutting the wafer into a plurality of bar members, each of the bar members having the aligned TMR elements, a measurement process for measuring a first resistance of the TMR element to be tested on the bar member by feeding a first sense current with a first current value through the TMR element, and measuring a second resistance of the TMR element by feeding a second sense current with a second current value of which absolute value is greater than that of the first current value through the TMR element, a calculation process for calculating a ratio of change in resistance from the measured first and second resistances of the TMR element, an evaluation process for evaluating the TMR element using the calculated ratio of change in resistance, and a separation process for cutting the evaluated bar member into individual magnetic head sliders, each of the individual magnetic head slider having the TMR element.

According to the present invention, also a manufacturing method of a TMR element includes a wafer process for forming many thin-film TMR elements on a wafer, a measurement process for measuring a first resistance of the TMR element to be tested on the wafer by feeding a first sense current with a first current value through the TMR element, and measuring a second resistance of the TMR element by feeding a second sense current with a second current value of which absolute value is greater than that of the first current value through the TMR element, a calculation process for calculating a ratio of change in resistance from the measured first and second resistances of the TMR element, an evaluation process for evaluating the TMR element using the calculated ratio of change in resistance, a cut process for cutting the evaluated wafer into a plurality of bar members, each of the bar members having the aligned TMR elements, and a separation process for cutting each bar member into individual magnetic head sliders, each of the individual magnetic head slider having the TMR element.

According to the present invention, further, a manufacturing method of a TMR element includes a wafer process for forming many thin-film TMR elements on a wafer, a cut process for cutting the wafer into a plurality of bar members, each of the bar members having the aligned TMR elements, a separation process for cutting each of the bar members into individual magnetic head sliders, each of the individual magnetic head slider having the TMR element, a measurement process for measuring a first resistance of the TMR element to be tested by feeding a first sense current with a first current value through the TMR element, and measuring a second resistance of the TMR element by feeding a second sense current with a second current value of which absolute value is greater than that of the first current value through the TMR element, a calculation process for calculating a ratio of change in resistance from the measured first and second resistances of the TMR element, and an evaluation process for evaluating the TMR element using the calculated ratio of change in resistance.

Measurement of resistances by feeding sense currents with different current values and calculation of a ratio of change in resistance from thus measured resistances allow confirmation of reliability of the TMR element. Also, the evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production.

It is preferred that the measuring process includes feeding a second sense current that is discontinuous to the first sense current through the TMR element. The second sense current is discontinuous to the first sense current means that feeding of the first sense current is stopped after the feeding thereof, and then the second sense current is fed.

It is also preferred that the calculation process includes calculating the ratio of change in resistance from a difference between the measured first and second resistances.

It is further preferred that the calculation process includes calculating the ratio of change in resistance from an expression of $(R_2-R_1)/R_1 \times 100 (\%)$, where the first resistance is indicated by $R_1$ and the second resistance is indicated by $R_2$.

It is also preferred that the evaluation process includes evaluating the TMR element as a non-defective product when the calculated ratio of change in resistance $(R_2-R_1)/R_1 \times 100$ (%) is less than a predetermined threshold. If the TMR element has a tunnel barrier layer made of an oxide of aluminum (Al) such as for example $Al_2O_3$, and the measurement process includes feeding a first sense current of 0.1 mA through the TMR element, and feeding a second sense current of 0.4 mA through the TMR element, it is preferred that the predetermined threshold is −0.8(%). If the tunnel barrier layer of the TMR element is made of a material other than the oxide of Al, it is possible to similarly evaluate the TMR element by correspondingly determining current values of the first and second sense currents and a threshold value of the resistance change ratio.

It is preferred that the measuring process includes applying an external DC magnetic field in a predetermined direction to the TMR element so that the measurement is performed under the applied external DC magnetic field.

It is preferred that the TMR element is a TMR head element or an MRAM cell.

According to the present invention, also, a TMR element manufactured by the above-mentioned manufacturing methods is provided.

It is preferred that the TMR element has a tunnel barrier layer made of an oxide of aluminum (Al) such as for example $Al_2O_3$.

Further objects and advantages of the present invention will be apparent from the following description of the preferred embodiments of the invention as illustrated in the accompanying drawings.

BRIEF DESCRIPTION OF THE SEVERAL VIEWS OF THE DRAWINGS

FIGS. 11a to 11f are graphs illustrating the measured element breakdown voltages versus the ratios of change in resistance dMRR (%) when a first sense current is kept at 0.1 mA and a second sense current is changed, with respect to many TMR read head elements;

DETAILED DESCRIPTION OF THE INVENTION

Before describing a preferred embodiment of the present invention, the story leading up to the present invention will be first discussed.

The inventors of this application had found that the changing characteristic in resistance of each TMR read head element differs between TMR read head elements with a predominance of metallic conduction and TMR read head elements with a predominance of tunnel current when the sense currents flowing through the TMR read head elements are increased up to a value at which the element breakdown might occur.

Figure 1:
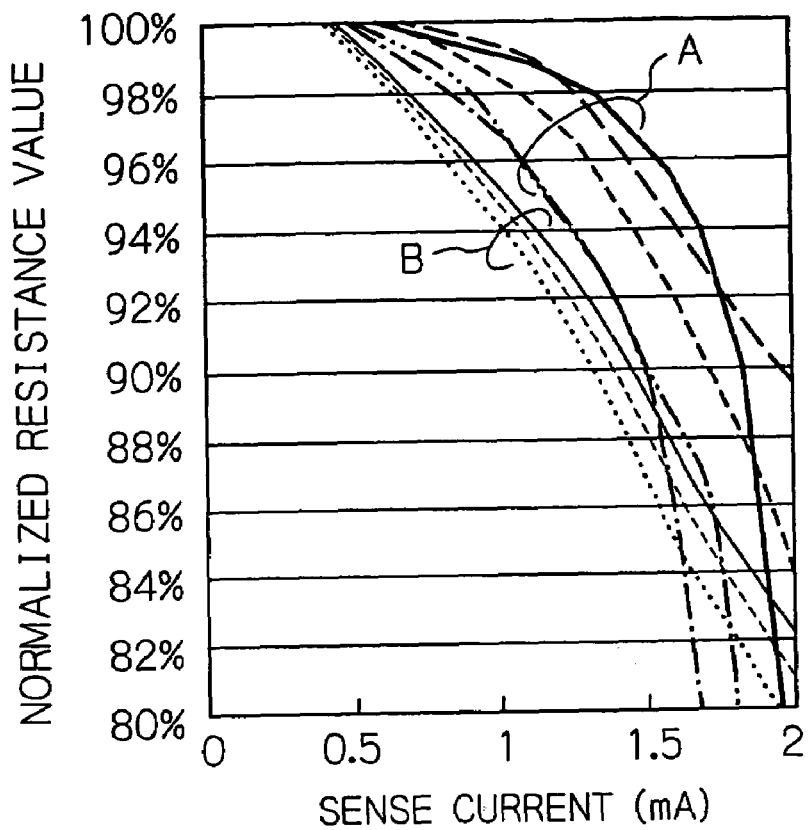
FIG. 1 is a graph illustrating relationships between sense currents and normalized resistances of a plurality of TMR read head elements.

FIG. 1 illustrates characteristics of normalized resistances (%) versus sense currents Is (mA) measured by the inventors with respect to a plurality of TMR read head elements.

As will be noted from the figure, there were two groups, that is, a group B of the TMR read head elements with resistances gradually decreasing when the sense currents increased and a group A of the TMR read head elements with resistances abruptly decreasing when the sense currents increased. In consequence of measurement of element breakdown voltages of the TMR read head elements in both groups, it was revealed that the TMR read head elements in the group B had low breakdown voltages whereas the TMR read head elements in the group A had high breakdown voltages. It was assumed that the TMR read head elements in the group B, provided with low breakdown voltages had pinholes in their barrier layers, and that the TMR read head elements in the group A, provided with high breakdown voltages had less pinhole in their barrier layers.

Then, it was considered that why the ratio of change in resistances differed with each other depending upon whether the barrier layers had pinhole or not.

Figure 2:
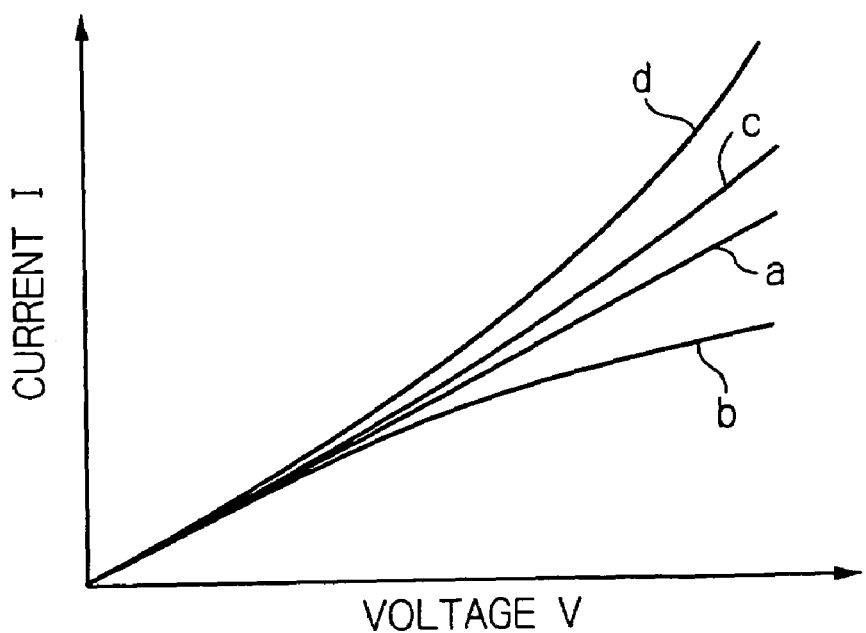
FIG. 2 is a graph illustrating assumed relationships between voltages applied to four TMR read head element models and currents flowing through the four TMR read head element models.

FIG. 2 illustrates assumed characteristics of currents flowing through four TMR read head element models versus the voltages applied to the four TMR read head element models.

In the figure, reference character "a" denotes a theoretical model of TMR read head element with pinholes in its barrier layer, in which increase in temperature is not considered, that is an ohmic conductive model similar to a normal metal resistor, "b" denotes an actual model of TMR read head element with pinholes in its barrier layer, in which increase in temperature is considered, "c" denotes a theoretical model of TMR read head element with less pinhole in its barrier layer, in which increase in temperature is not considered, and "d" denotes an actual model of TMR read head element with less pinhole in its barrier layer, in which increase in temperature is considered, respectively.

The theoretical TMR read head element model "a" with pinholes behaves as similar as a metallic conductor. Namely, current flowing there through increases in proportional to increase in voltage applied thereto. Whereas current flowing through the actual TMR read head element model "b" with pinholes increases not so much as that in the theoretical model "a" when the voltage applied thereto increases. This is because when the applied voltage increases, the temperature of this model "b" ascends and thus its resistance increases. Current flowing through the theoretical TMR read head element model "c" with less pinhole increases greater than that in the theoretical model "a" when the voltage applied thereto increases. This is because when the voltage applied to the model "c" increases, its element resistance somewhat decreases. Current flowing through the actual TMR read head element model "d" with less pinhole increases much greater than that in the theoretical model "c" when the voltage applied thereto increases. This is because when the voltage applied to the model "d" increases, its element temperature ascends to activate electrons and thus its resistance greatly decreases.

Thus, the inventors considered that there are two different tends in resistance change between the TMR read head element with pinholes and the TMR read head element with less pinhole, and this difference is appeared as the changing characteristics in resistance depending upon the value of the sense current Is.

Hereinafter, the present invention will be described in detail based upon a preferred embodiment.

Figure 3:
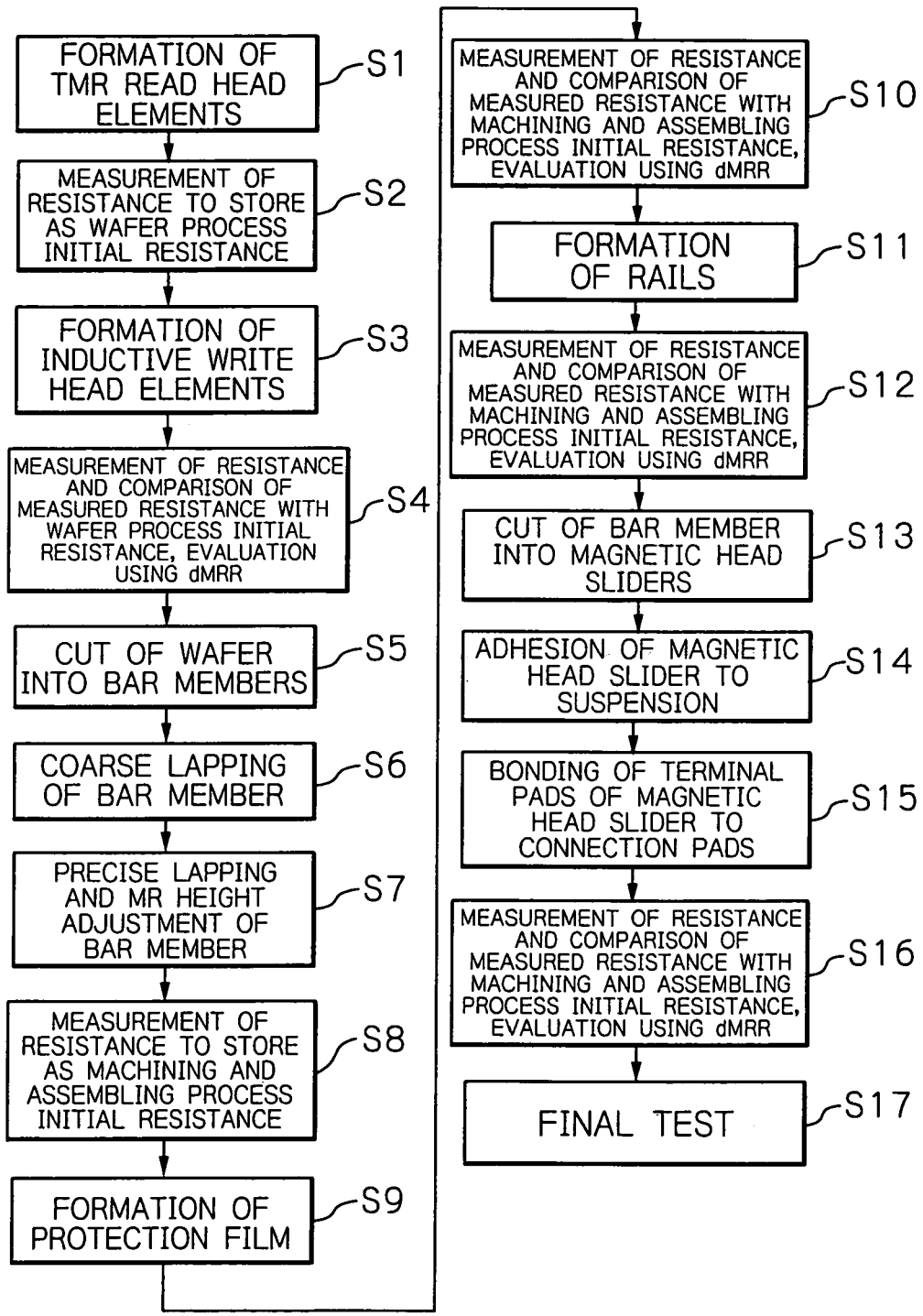
FIG. 3 is a flow chart schematically illustrating a wafer process for fabricating thin-film magnetic heads with TMR read head elements and an assembling process for forming HGAs as a preferred embodiment according to the present invention.

FIG. 3 schematically illustrates a wafer process for fabricating thin-film magnetic heads with TMR read head elements and an assembling process for forming HGAs as a preferred embodiment according to the present invention, and FIGS. 4a to 4d illustrate a part of the processes shown in FIG. 3.

First, many TMR read head elements such as TMR read head elements with a longitudinal magnetic recording structure or a perpendicular magnetic recording structure are formed in matrix on a thin-film integration surface of a wafer for thin-film (Step S1).

Figure 5:
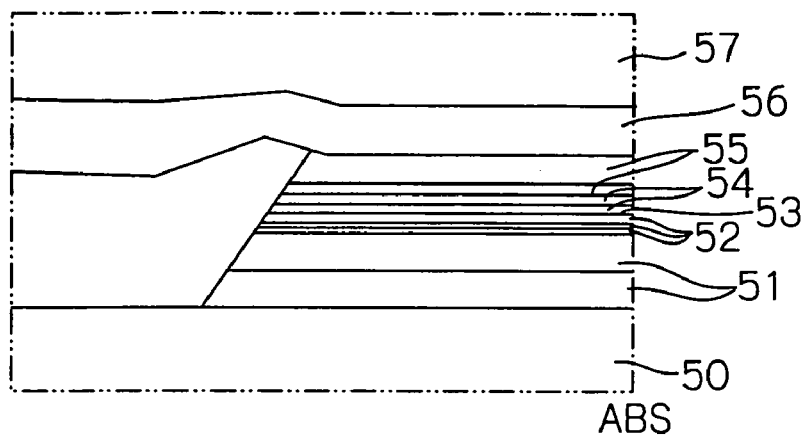
FIG. 5 is a sectional view, seen along a direction orthogonal to an air-bearing surface (ABS) of the head element, illustrating an example structure of each TMR read head element in the embodiment of FIG. 3.
Figure 6:
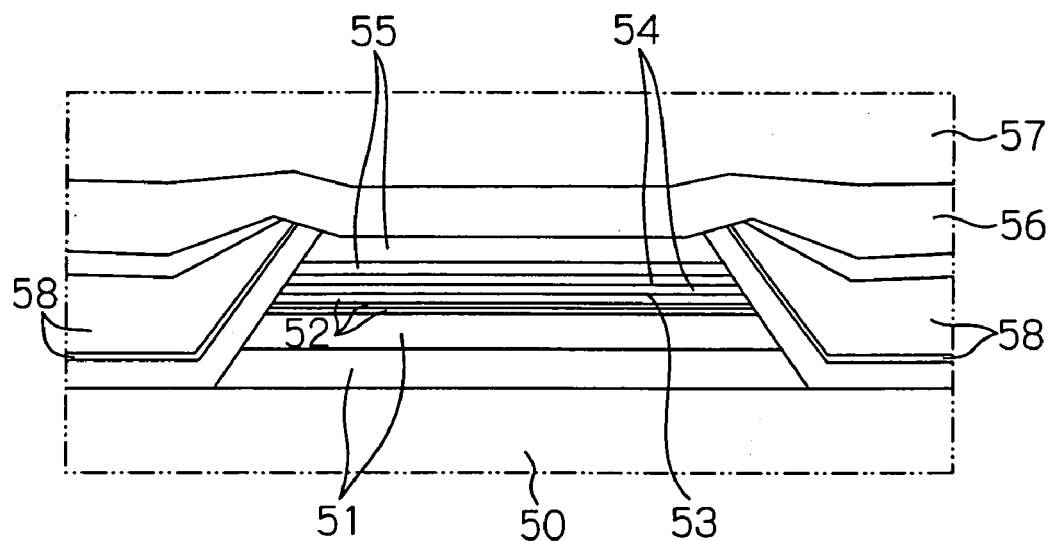
FIG. 6 is a sectional view, seen from the ABS, illustrating the TMR read head element of FIG. 5.

FIGS. 5 and 6 illustrate an example structure of each TMR read head element thus formed. FIG. 5 shows a section seen along a direction orthogonal to the ABS of the TMR read head element and FIG. 6 shows is a section seen from the ABS.

As shown in FIGS. 5 and 6, a TMR film of the TMR read head element has a multilayered structure of an anti-ferromagnetic layer (pin layer) 51, a pined layer 52, a tunnel barrier layer 53, a free layer 54 and a cap layer 55 sequentially laminated on a lower shield and electrode layer 50. On the TMR film, a metal gap layer 56 and an upper shield and electrode layer 57 are laminated. Bias layers 58 are formed in lateral regions located in the track-width direction of the TMR film. In modifications, the order of lamination of the TMR multi-layers may be in inverse. The tunnel barrier layer 53 is made of oxide of Al, Ti, Zr, Hf, Ta, Mg or else.

Then, a resistance of each TMR read head element is measured (Step S2). The resistance is measured using a test apparatus that will be mentioned later by bringing a pair of probes into electrical contact with terminal pads of each TMR read head element in the wafer, feeding a sense current with a first current value of for example 0.1 mA through the TMR read head element, and measuring its output voltage to calculate the resistance of the TMR read head element. Each calculated resistance is stored in the test apparatus as a wafer process initial resistance $R_0$.

Figure 4A:
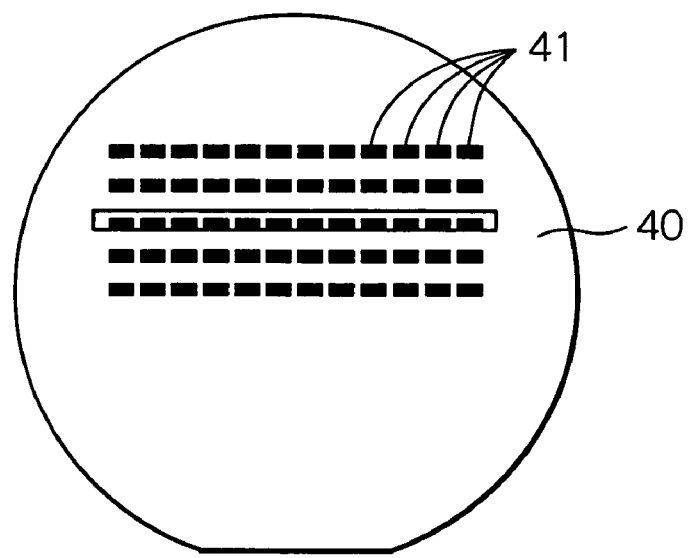
FIGS. 4a to 4d are views illustrating a part of the processes shown in FIG. 3.

Thereafter, inductive write head elements are formed on the respective TMR read head elements (Step S3). FIG. 4a illustrates a wafer 40 on which many thin-film magnetic head elements 41 consisting of the TMR read head elements and the inductive write head elements are thus formed in matrix.

After forming the inductive write head elements on the wafer, a resistance of each TMR read head element is measured and also a ratio of change in resistance dMRR (%) of each TMR read head element is obtained (Step S4). The resistance is measured using the test apparatus by bringing the pair of probes into electrical contact with terminal pads of each TMR read head element in the wafer, feeding a first sense current with the first current value of for example 0.1 mA through the TMR read head element, and measuring its output voltage to calculate the resistance of the TMR read head element. Each calculated resistance is stored in the test apparatus as a first resistance $R_1$. The ratio of change in resistance dMRR (%) is obtained using the test apparatus by feeding a second sense current with a second current value of for example 0.4 mA, which is greater than the first current value, through the TMR read head element in a discontinuous manner with respect to the first sense current with the first current value, measuring its output voltage to calculate the resistance of the TMR read head element and to store the calculated resistance in the test apparatus as a second resistance $R_2$, and then calculating the resistance change ratio dMRR (%) from dMRR (%)=$(R_2-R_1)/R_1 \times 100$. The calculated ratio dMRR (%) is stored in the test apparatus. In this specification, feeding of the second sense current "in a discontinuous manner" with respect to the first sense current means that feeding of the first sense current is stopped after the feeding thereof, and then the second sense current is fed. Contrary to this, feeding of the second sense current "in a continuous manner" with respect to the first sense current means that the first sense current is fed and then the second sense current is fed without stopping the feeding of the first sense current until start of the second sense current feeding. In the present invention, it is preferred that the second sense current is fed in a discontinuous manner with respect to the first sense current. However, in modifications, the second sense current may be fed in a continuous manner with respect to the first sense current.

By comparing the first resistance $R_1$ obtained at Step S4 and the wafer process initial resistance $R_0$ obtained at Step S2 with each other, if there is a difference in resistance, it is considered that the resistance of the tunnel barrier layer 53 has changed during the forming process of the inductive write head elements. This change in resistance of the barrier layer may be caused by increased mobility in oxygen or applied electrical or physical damage. In such case, a degree of metallic conduction in the barrier layer is evaluated from the resistance change ratio dMRR (%). This evaluation is performed in this embodiment by judging whether the calculated resistance change ratio dMRR (%) is less than a predetermined threshold of −0.8% or not, namely whether the ratio dMRR (%) is negative and its absolute value is more than 0.8% or not.

The process of the above-mentioned Steps S1-S4 is the wafer process.

Figure 4B:
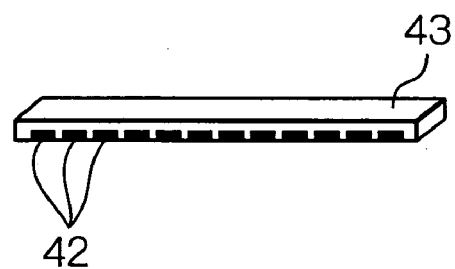

Thereafter, the wafer 40 is cut into a plurality of bar members or row bars 43 each of which has a plurality of thin-film magnetic heads 42 aligned along the bar member (Step S5). FIG. 4b illustrates thus formed bar member 43.

Then, a lapping surface of this bar member 43 located at the ABS side is roughly lapped (Step S6), and then this lapping surface is precisely lapped to adjust the MR height (Step S7).

Thereafter, a resistance of each TMR read head element is measured and also a ratio of change in resistance dMRR (%) of each TMR read head element is obtained (Step S8). The resistance and the ratio of change in resistance dMRR (%) are obtained in the similar manner as done at Step S4. However, at Step S8, the calculated first resistance $R_1$ is also stored in the test apparatus as a machining and assembling process initial resistance $R_0'$. At Step S8, furthermore, each TMR read head element is evaluated by judging whether the calculated resistance change ratio dMRR (%) is less than a predetermined threshold of −0.8% or not, namely whether the ratio dMRR (%) is negative and its absolute value is more than 0.8% or not. If the ratio dMRR (%) is less than the threshold of −0.8%, a degree of metallic conduction in the barrier layer is low and thus it is evaluated that this TMR read head element is non-defective product with a high element breakdown voltage. Whereas, if the ratio dMRR (%) is equal to or more than the threshold of −0.8%, the lapping may inflict damage to the TMR read head element to provide a high metallic conduction in the barrier layer due to occurrence of pinholes or provide a short-circuit around the barrier layer due to flaws or scratches (smears) occurred by lapping, and thus it is evaluated that this TMR read head element is defective product with a low element breakdown voltage.

For the TMR read head elements with resistance change ratios dMRR (%) after lapping being less than −0.8%, it is possible to confirm, from an average value of their resistances, whether a target MR height is attained or not, and also it is possible to estimate, from the resistance value distribution of the TMR read head elements on the bar member, a distribution and a deviation of MR height adjusted amounts of these TMR read head elements.

In case that resistance change ratios dMRR (%) after lapping are equal to or more than −0.8%, lapping conditions may be modified. It is possible to control time duration and condition of the etching or milling process for recovering from short-circuit by monitoring whether the resistance change ratio dMRR (%) becomes less than −0.8% or not.

Then, a protection film is formed on the lapped surface of the bar member (Step S9).

Thereafter, a resistance of each TMR read head element is measured and also a ratio of change in resistance dMRR (%) of each TMR read head element is obtained (Step S10). The resistance and the ratio of change in resistance dMRR (%) are obtained in the similar manner as done at Step S4. At Step S10, by comparing the first resistance $R_1$ obtained at this Step S10 and the machining and assembling process initial resistance $R_0'$ obtained at Step S8 with each other, if there is a difference in resistance, it is considered that the resistance of the tunnel barrier layer 53 has changed by damage due to ion milling or oxidization after the lapping process. In such case, a degree of metallic conduction in the barrier layer is evaluated from the resistance change ratio dMRR (%). This evaluation is performed in this embodiment by judging whether the calculated resistance change ratio dMRR (%) is less than a predetermined threshold of −0.8% or not, namely whether the ratio dMRR (%) is negative and its absolute value is more than 0.8% or not. If the ratio dMRR (%) is less than the threshold of −0.8%, a degree of metallic conduction in the barrier layer is low and thus it is evaluated that this TMR read head element is non-defective product with a high element breakdown voltage. Whereas, if the ratio dMRR (%) is equal to or more than the threshold of −0.8%, the ion milling or oxidization may inflict damage to the TMR read head element to provide a high metallic conduction in the barrier layer due to occurrence of pinholes, and thus it is evaluated that this TMR read head element is defective product with a low element breakdown voltage.

Then, on the surface of the ABS side of the bar member, rails are formed by ion milling or else (Step S11).

Thereafter, a resistance of each TMR read head element is measured and also a ratio of change in resistance dMRR (%) of each TMR read head element is obtained (Step S12). The resistance and the ratio of change in resistance dMRR (%) are obtained in the similar manner as done at Step S4. At Step S12, by comparing the first resistance $R_1$ obtained at this Step S12 and the machining and assembling process initial resistance $R_0'$ obtained at Step S8 with each other, if there is a difference in resistance, it is considered that the resistance of the tunnel barrier layer 53 has changed by damage due to ion milling at the rail forming process. In such case, a degree of metallic conduction in the barrier layer is evaluated from the resistance change ratio dMRR (%). This evaluation is performed in this embodiment by judging whether the calculated resistance change ratio dMRR (%) is less than a predetermined threshold of −0.8% or not, namely whether the ratio dMRR (%) is negative and its absolute value is more than 0.8% or not. If the ratio dMRR (%) is less than the threshold of −0.8%, a degree of metallic conduction in the barrier layer is low and thus it is evaluated that this TMR read head element is non-defective product with a high element breakdown voltage. Whereas, if the ratio dMRR (%) is equal to or more than the threshold of −0.8%, the ion milling may inflict damage to the TMR read head element to provide a high metallic conduction in the barrier layer due to occurrence of pinholes, and thus it is evaluated that this TMR read head element is defective product with a low element breakdown voltage.

Figure 4C:
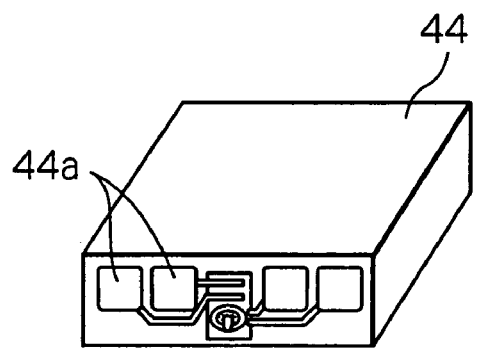

Then, the bar member 43 is cut and separated into a plurality of individual magnetic head sliders 44 (Step S13). FIG. 4c illustrates each separated magnetic head slider 44.

The process of the above-mentioned Steps S5-S13 is the machining process.

Thereafter, the magnetic head slider 44 is adhered to a suspension 45 to form an HGA 46 (Step S14), and then terminal pads 44a of the magnetic head slider 44 are bonded to connection pads of a wiring member formed or attached on the suspension 45 (Step S15).

Figure 4D:
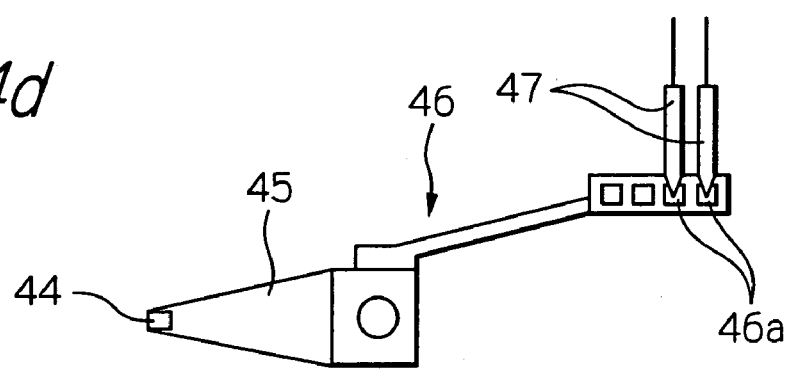

Then, a resistance of the TMR read head element is measured and also a ratio of change in resistance dMRR (%) of the TMR read head element is obtained (Step S16). The resistance is measured, as illustrated in FIG. 4d, by bringing a pair of probes 47 into electrical contact with external connection pads 46a electrically connected to the connection pads of the HGA in the similar manner as done at Step S4, and also the ratio of change in resistance dMRR (%) is obtained. At Step S16, by comparing the first resistance $R_1$ obtained at this Step S16 and the machining and assembling process initial resistance $R_0'$ obtained at Step S8 with each other, if there is a difference in resistance, it is considered that the resistance of the tunnel barrier layer 53 has changed by damage due to spark at the bonding process. In such case, a degree of metallic conduction in the barrier layer is evaluated from the resistance change ratio dMRR (%). This evaluation is performed in this embodiment by judging whether the calculated resistance change ratio dMRR (%) is less than a predetermined threshold of −0.8% or not, namely whether the ratio dMRR (%) is negative and its absolute value is more than 0.8% or not. If the ratio dMRR (%) is less than the threshold of −0.8%, a degree of metallic conduction in the barrier layer is low and thus it is evaluated that this TMR read head element is non-defective product with a high element breakdown voltage. Whereas, if the ratio dMRR (%) is equal to or more than the threshold of −0.8%, bonding spark may inflict damage to the TMR read head element to provide a high metallic conduction in the barrier layer due to occurrence of pinholes, and thus it is evaluated that this TMR read head element is defective product with a low element breakdown voltage.

Thereafter, a final test process is performed (Step S17). At this final test process, for example a performance test such as an electromagnetic conversion performance test of the TMR read head element is performed.

The process of the above-mentioned Steps S14-S17 is the assembling process.

In this embodiment, the resistance of the TMR read head element measured just after the TMR read head element is fabricated in the wafer process is determined as the wafer process initial resistance $R_0$. This is because no damage will be occurred in the barrier layer of the TMR read head element at this stage, and thus this resistance measured just after fabrication of the TMR read head element is used as a reference value for comparison. Also, in the machining process and the assembling process, the resistance of the TMR read head element measured just after the MR height adjustment is performed is determined as the machining and assembling process initial resistance $R_0'$. This is because the resistances before and after the MR height adjustment greatly differ with each other, and thus this resistance measured just after the MR height adjustment is used as a reference value for comparison.

At the aforementioned Steps S2, S4, S8, S10, S12 and S16, only measurement of dMRR (%) may be executed. Furthermore, all of these Steps S2, S4, S8, S10, S12 and S16 may be unnecessary to execute, but in modifications a part of these Steps may be performed.

Figure 7:
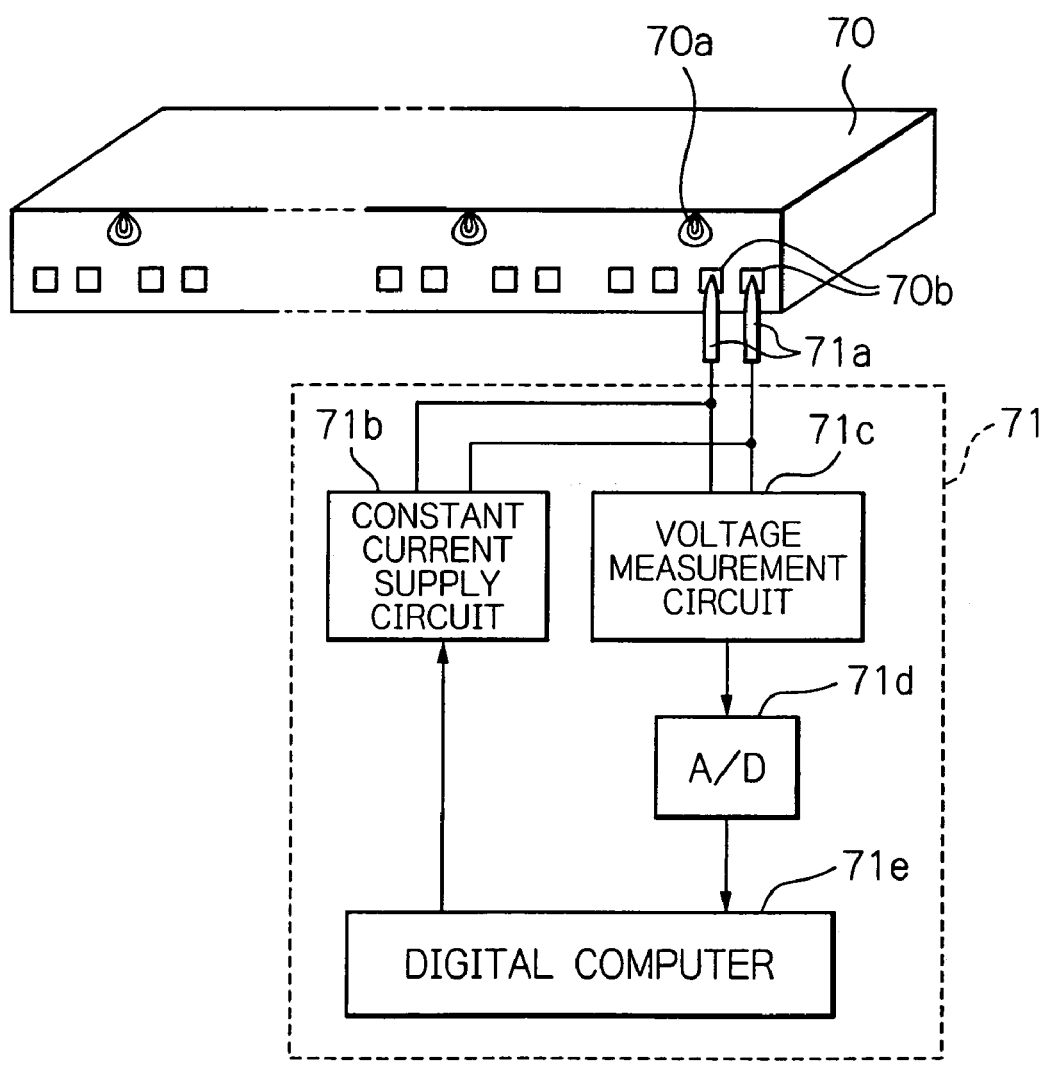
FIG. 7 is a view schematically illustrating a partial configuration of testing a TMR read head element in the embodiment of FIG. 3.

FIG. 7 schematically illustrates a configuration of testing the TMR read head element in the embodiment of FIG. 3.

In the figure, reference numeral 70 denotes the bar member with a plurality of aligned TMR read head elements that are not individually separated yet, and 71 denotes a testing apparatus of the TMR read head element.

Each TMR read head element 70a of the bar member 70 is provided with a TMR read head element, an inductive write head element, a pair of terminal pads 70b electrically connected to the TMR read head element, and a pair of terminal pads electrically connected to the inductive write head element.

The testing apparatus 71 has a pair of probes 71a that can be electrically contact to the pair of terminal pads 70b of the TMR read head element, a constant current supply circuit 71b electrically connected to the pair of probe 71a, for feeding a sense current of different current values to the TMR read head element, a voltage measurement circuit 71c electrically connected to the pair of probe 71a, for measuring voltage across the TMR read head element, an analog to digital (A/D) converter 71d electrically connected to the voltage measurement circuit 71c, for converting its analog output into digital signals, and a digital computer 71e electrically connected to the A/D converter 71d and the constant current supply circuit 71b. The digital computer 71e sequentially receives the digital signals from the A/D converter 71d and calculates resistance values at the respective sense currents fed to the TMR read head element so as to judge whether or not the TMR read head element is defective. Also, the digital computer 71e controls the operations of the constant current supply circuit 71b and the A/D converter 71d.

Figure 8:
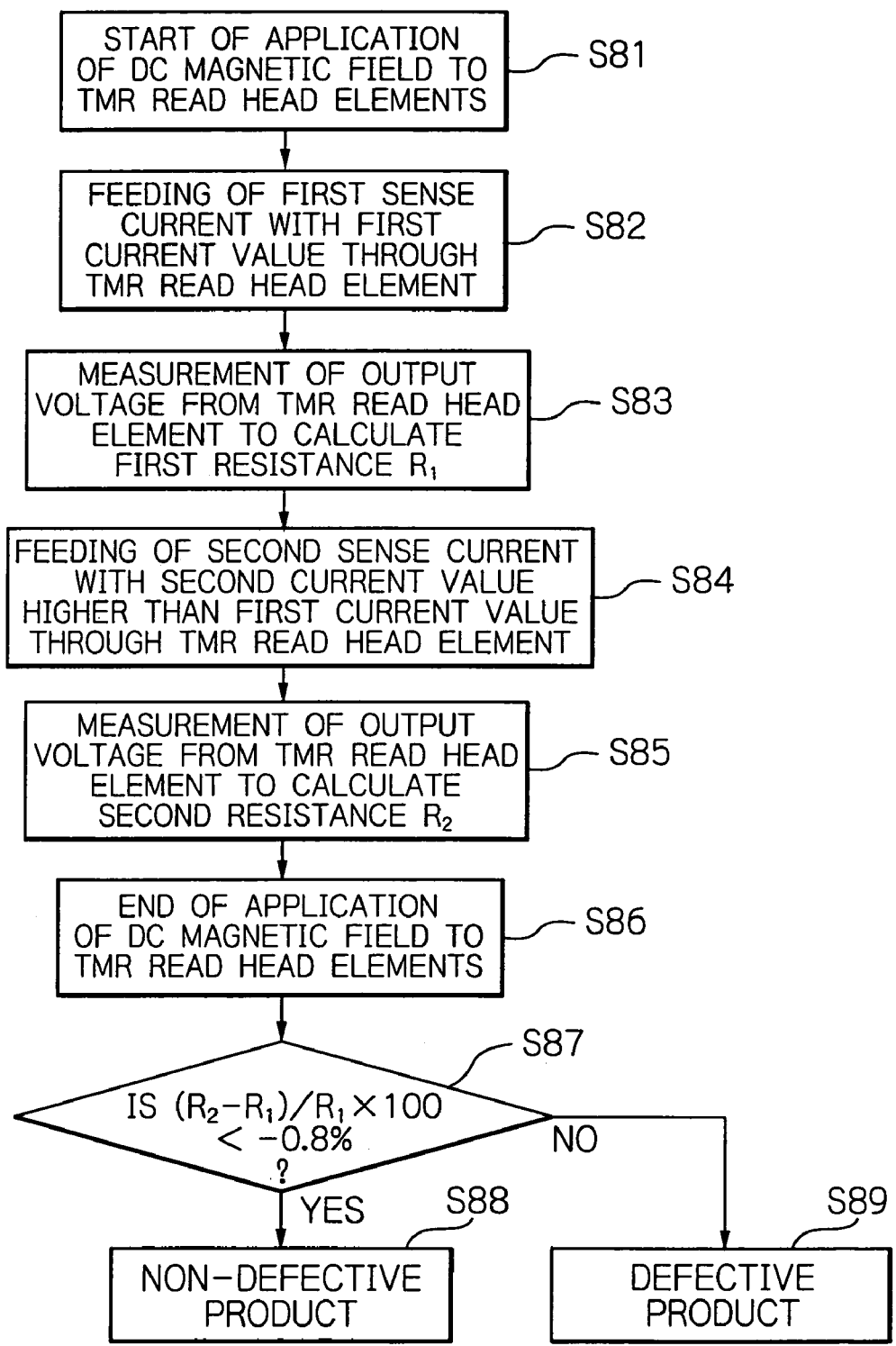
FIG. 8 is a flow chart illustrating a testing procedure in the embodiment of FIG. 1.

FIG. 8 illustrates a testing procedure of the testing apparatus 71 in this embodiment.

First, application of an external DC magnetic field from a DC magnetic field generation device (not shown) to the bar member 70 is started (Step S81). This applied DC magnetic field keeps the relationship between a magnetization direction in the pin layer of the TMR read head element and a magnetization direction in the free layer of the TMR read head element constant.

Then, the pair of probes 71a are brought into electrical contact with the terminal pads 70b of the TMR read head element to be tested in the bar member 70, and under this state a first sense current with a first current value of 0.1 mA for example is fed through the TMR read head element from the constant current supply circuit 71b (Step S82).

Then, a value of the voltage output from the TMR read head element is measured by the voltage measurement circuit 71c and the measured voltage value is input into the computer 71e to calculate a resistance value of the TMR read head element (Step S83). The resistance value can be easily calculated from the first current value, for example 0.1 mA, and from the measured voltage value. The calculated resistance value is stored in the computer 71e as a first resistance $R_1$. The calculated first resistance $R_1$ at this stage is also stored as a machining and assembling process initial resistance $R_0'$.

Then, a second sense current with a second current value of 0.4 mA for example, which is higher than the first current value is fed through the TMR read head element in a discontinuous manner with respect to the first sense current from the constant current supply circuit 71b (Step S84).

Then, a value of the voltage output from the TMR read head element is measured by the voltage measurement circuit 71c and the measured voltage value is input into the computer 71e to calculate a resistance value of the TMR read head element (Step S85). The resistance value is calculated from the second current value, for example 0.4 mA, and from the measured voltage value. The calculated resistance value is stored in the computer 71e as a second resistance $R_2$.

Then, the application of the external DC magnetic field to the bar member 70 is finished (Step S86).

Thereafter, a ratio of change in resistance dMRR (%) is calculated from the first resistance R1 and the second resistance R2 using an equation of dMRR (%)=(R2−R1)/R1×100, and whether the calculated resistance change ratio dMRR (%) is less than a predetermined threshold of −0.8% or not, namely whether the ratio dMRR (%) is negative and its absolute value is more than 0.8% or not is judged (Step S87).

If yes, namely the ratio dMRR (%) is less than the threshold of −0.8%, it is evaluated that this TMR read head element is non-defective product with a high element breakdown voltage (Step S88). Whereas, if the ratio dMRR (%) is equal to or more than the threshold of −0.8%, it is evaluated that this TMR read head element is defective product with a low element breakdown voltage (Step S89).

Then, the remaining TMR read head elements in the bar member 70 are sequentially evaluated in the same manner.

Figure 9:
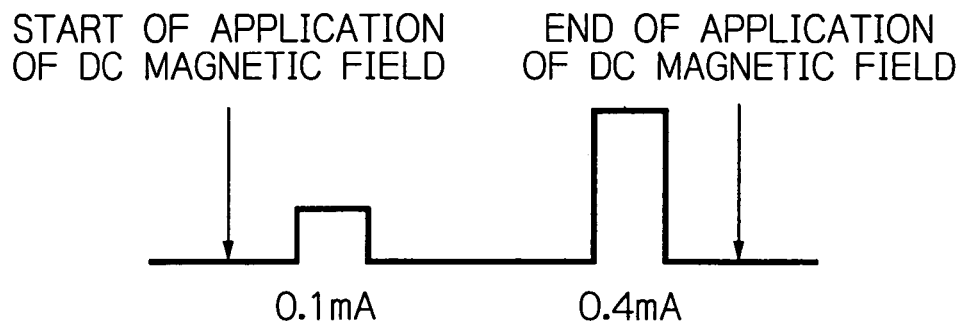
FIG. 9 is a current waveform view illustrating a sequence of the testing procedure of FIG. 8.

FIG. 9 illustrates a sequence of the testing procedure of FIG. 8.

As will be apparent from this figure, in this testing procedure, first, application of the DC magnetic field to the TMR read head element is started. Then, the rectangular-shaped first sense current with the low first current value of for example 0.1 mA is fed through the TMR read head element to obtain the first resistance $R_1$ at that time. Then, the rectangular-shaped second sense current with the second current value of for example 0.4 mA higher than the first current value is fed through the TMR read head element to obtain the second resistance $R_2$ at that time. Thereafter, the application of the DC magnetic field to the TMR read head element is ended. Then, the ratio of change in resistance dMRR (%) is calculated from dMRR (%)=$(R_2-R_1)/R_1 \times 100$. Defective/non-defective evaluation of the TMR read head element is performed whether the calculated resistance change ratio dMRR (%) is less than a predetermined threshold of −0.8% or not.

Figure 10:
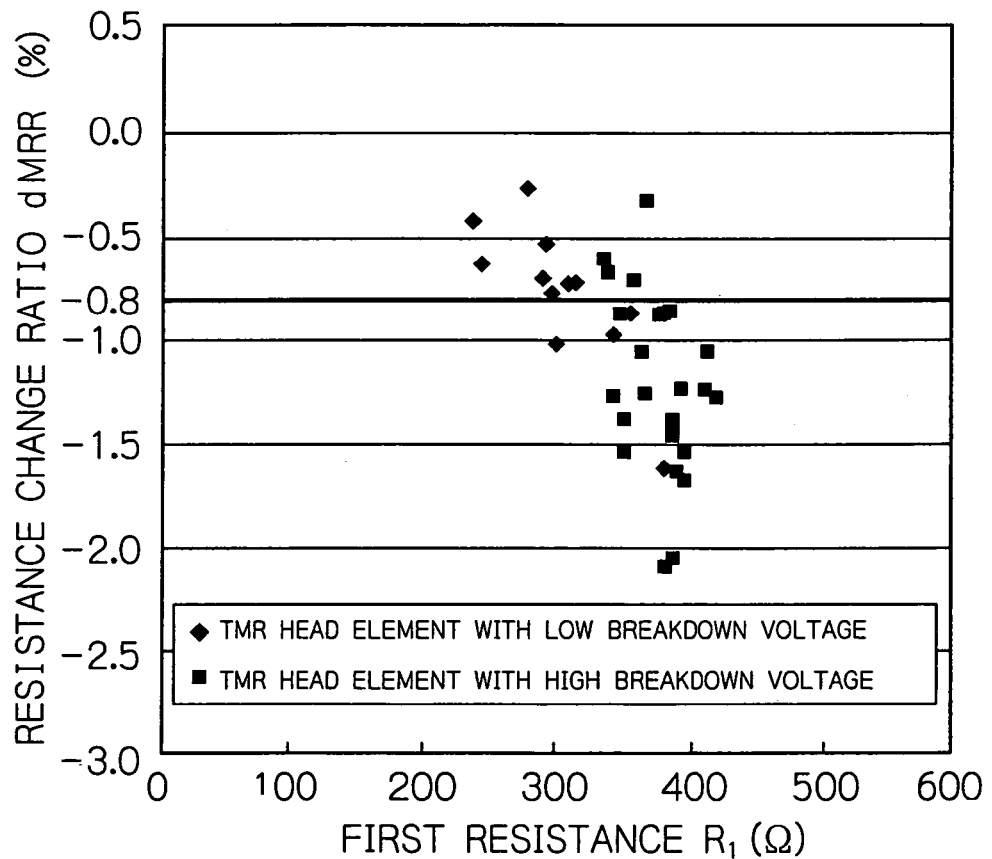
FIG. 10 is a graph illustrating ratios of change in resistance dMRR (%) calculated from the measured first resistances $R_1$ when a first sense current of 0.1 mA flows and the measured second resistances $R_2$ when a second sense current of 0.4 mA flows, with respect to many TMR read head elements.

FIG. 10 illustrates resistance change ratios dMRR (%) thus calculated from the measured first resistances $R_1$ when the first sense current of 0.1 mA is fed and the measured second resistances $R_2$ when the second sense current of 0.4 mA is fed, with respect to many TMR read head elements. In the figure, the lateral axis represents the first resistance value $R_1$ ($\Omega$) and the longitudinal axis represents the resistance change ratio dMRR (%).

It is evaluated that the TMR read head elements with resistance change ratios dMRR (%) less than −0.8(%) are non-defective products with less pinhole in their barrier layers, and that the TMR read head elements with resistance change ratios dMRR (%) equal to or more than −0.8(%) are defective products with pinholes in their barrier layers or with short-circuits around the barrier layers.

In the above-mentioned embodiment, the threshold value of the resistance change ratio dMRR (%) is determined as −0.8(%). This threshold value is used under the condition that the tunnel barrier layer of the TMR read head element is made of oxide of Al, such as $Al_2O_3$ for example, the first sense current has a value of 0.1 mA, and the second sense current has a value of 0.4 mA. In case that the tunnel barrier layer of the TMR read head element is made of a material other than the oxide of Al, it is possible to similarly evaluate the TMR read head element by correspondingly determining current values of the first and second sense currents and a threshold value of the resistance change ratio dMRR (%). In other words, the threshold value of the resistance change ratio dMRR (%) is not limited to the above-mentioned value in this embodiment, but determined depending upon the specification of the TMR read head element.

Also, the first sense current fed to measure the first resistances $R_1$ and the second sense current fed to measure the second resistances $R_2$ are not limited to have the aforementioned first and second current values, but may have arbitrary first and second current values if the absolute first and second current values are lower than the breakdown current of the TMR read head element and the absolute second current value is higher than the absolute first current value. For example, if the first current value is 0.1 mA, the second current value will be determined to a value higher than 0.1 mA but lower than the breakdown current value of the TMR read head element. Of course, the first current value may be determined to a value other than 0.1 mA. In modifications of this embodiment, a second sense current with a second current value may be first fed to the TMR read head element, and thereafter a first sense current with a first current value lower than the second current value may be fed to the TMR read head element.

FIGS. 11a to 11f illustrate the measured element breakdown voltages versus the resistance change ratios dMRR (%) when the first sense current is kept at 0.1 mA and the second sense current is changed, with respect to many TMR read head elements.

FIG. 11a is a case the second sense current has a second current value of 0.15 mA, FIG. 11b is a case the second sense current has a second current value of 0.2 mA, FIG. 11c is a case the second sense current has a second current value of 0.3 mA, FIG. 11d is a case the second sense current has a second current value of 0.4 mA, FIG. 11e is a case the second sense current has a second current value of 0.5 mA, and FIG. 11f is a case the second sense current has a second current value of 0.8 mA. The similar distribution characteristics are obtained for the different second current values.

The first and second sense currents of the aforementioned embodiment are rectangular shaped pulse currents that are discontinuous with each other. However, in modifications, these first and second sense currents may be a continuous sense current with different levels. Durations of the first and second sense currents are arbitrary, and, in case of the rectangular shaped pulse currents, an interval of them is also arbitrary.

The sense current is fed to flow upward in the laminating direction of layers (from the substrate side or lower side to the anti-substrate side or upper side in the laminating direction) or to flow downward in the laminating direction (from the anti-substrate side or upper side to the substrate side or lower side in the laminating direction) of the TMR read head element irrespective of the laminated order of the TMR layer.

Figure 12A:
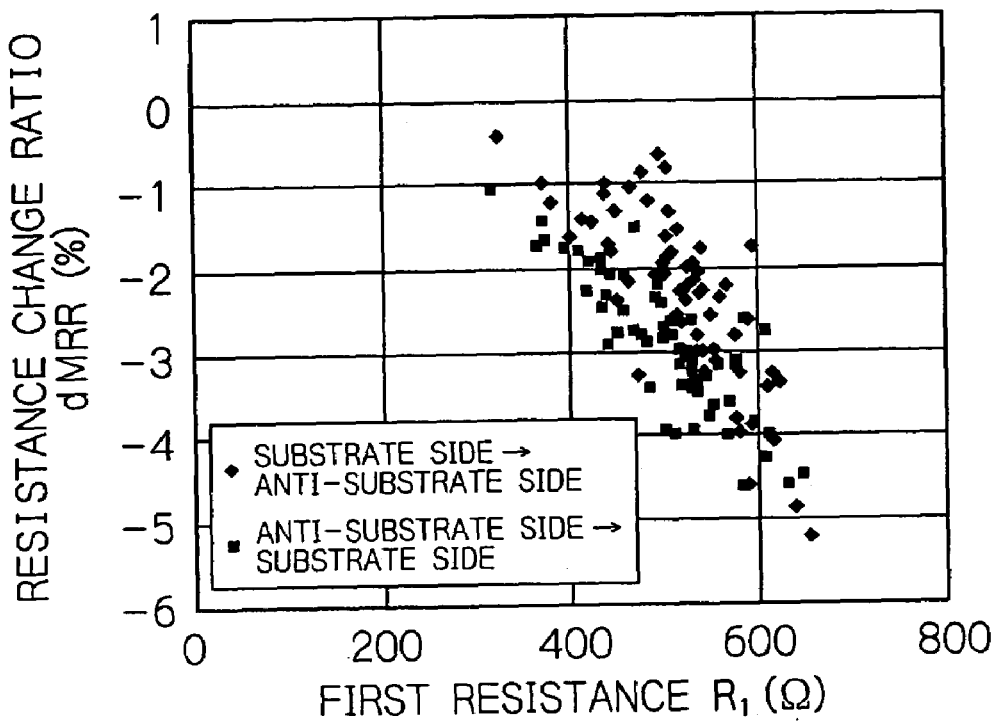
FIGS. 12a and 12b are graphs illustrating the measured ratios of change in resistance dMRR (%) versus the first resistance $R_1$ when a current flows in the opposite directions, with respect to many TMR read head elements.
Figure 12B:
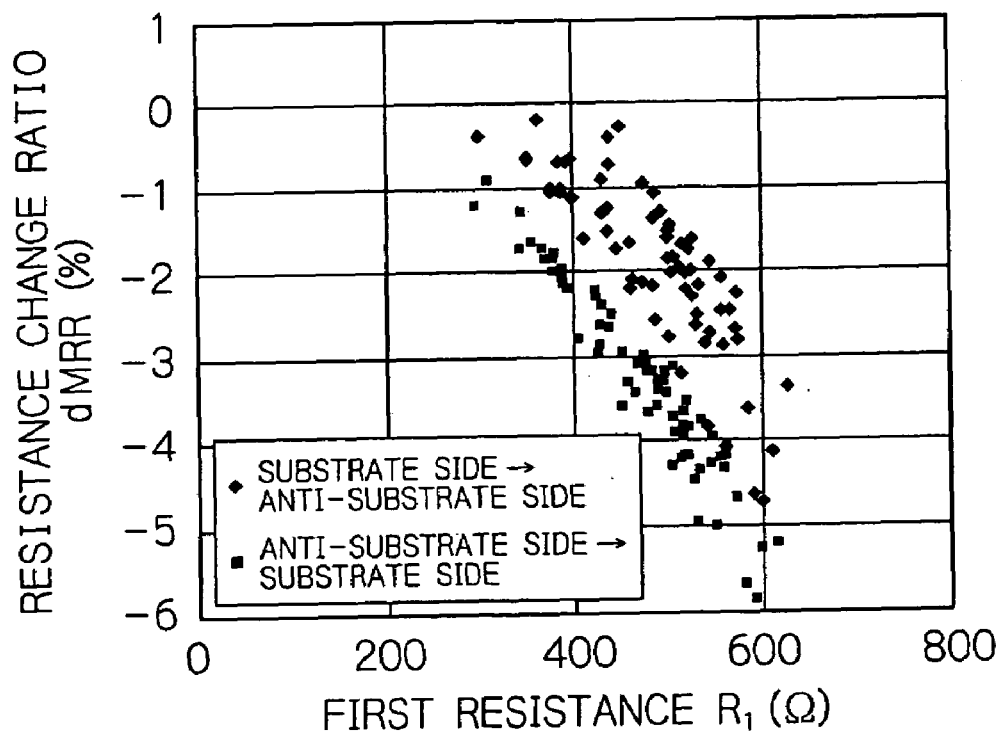

FIGS. 12a and 12b illustrate the measured resistance change ratios dMRR (%) versus the first resistance $R_1$ when a current is fed to flow in the opposite directions, with respect to many TMR read head elements in different lots, respectively. In these figures, the lateral axis represents the first resistance value $R_1$ ($\Omega$) and the longitudinal axis represents the resistance change ratio dMRR (%).

As will be noted from these figures, the similar distribution characteristics can be obtained even if the sense current is fed to flow from the substrate side to the anti-substrate side or to flow from the anti-substrate side to the substrate side. However, the threshold value of the resistance change ratio dMRR (%) should be changed in response to the flowing direction of the sense current because an offset may be added to the ratio dMRR (%) depending upon the flowing direction.

As will be understood, according to this embodiment, the sense currents with different current values are fed to the TMR read head element and the resistances of the TMR read head element at the different current values are measured to calculate the resistance change ratio dMRR (%). Then, evaluation is performed by judging whether the calculated resistance change ratio dMRR (%) is less than a predetermined threshold or not. If the ratio dMRR (%) is less than the threshold, it is evaluated that the TMR read head element is non-defective product with a high element breakdown voltage, but if the ratio dMRR (%) is equal to or more than the threshold, it is evaluated that the TMR read head element is defective product with a low element breakdown voltage. Therefore, evaluation test of non-defective and defective products can be extremely easily and quickly performed. Also, according to this embodiment, because this evaluation test can be performed without destroying the TMR read head element, 100% inspection of the manufactured TMR read head elements becomes possible. As a result, a reliability of the TMR element can be quickly and easily confirmed without failing, and thus it is extremely effective for mass-production.

In the above-mentioned embodiments, two sense currents with different current values are fed to the TMR read head element and two resistances of the TMR read head element at the different current values are measured to calculate the resistance change ratio dMRR (%). However, in modifications, three or more sense currents with different current values may be fed to the TMR read head element and three or more resistances of the TMR read head element at the different current values may be measured to calculate the resistance change ratios dMRR (%) to evaluate the TMR read head element.

Although the aforementioned embodiments concern the method and apparatus for testing the TMR read head element, it is apparent that the present invention can be similarly applied to a test of an MRAM cell.

Figure 13:
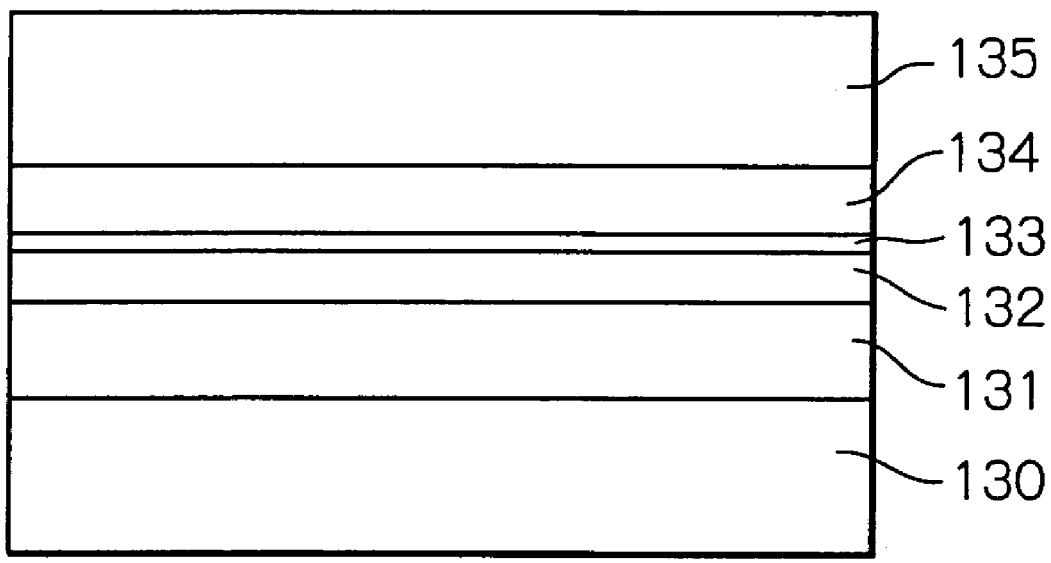
FIG. 13 is a sectional view illustrating a structure example of an MRAM cell fabricated in another embodiment according to the present invention.

FIG. 13 illustrates a structure example of an MRAM cell fabricated in another embodiment according to the present invention.

As shown in the figure, the MRAM cell has a TMR structure with an anti-ferromagnetic layer 131, a pinned layer 132, a tunnel barrier layer 133, a free layer 134 and an upper conductor layer 135 constituting a word line sequentially laminated on a lower conductor layer 130 constituting a bit line. A manufacturing method, a test method and a test apparatus in this embodiment, and also other configurations, operations and advantages in this embodiment are substantially similar to these in the embodiment of FIG. 3 except that this embodiment has no machining process nor test process for a bar member.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method for testing a tunnel magnetoresistive effect element comprising the steps of:
    measuring a plurality of resistances of said tunnel magnetoresistive effect element by feeding a plurality discontinuous of sense currents with different current values each other through said tunnel magnetoresistive effect element;
    calculating a ratio of change in resistance from the measured plurality of resistances of said tunnel magnetoresistive effect element
    evaluating said tunnel magnetoresistive effect element using the calculated ratio of change in resistance.

2. The method as claimed in claim 1, wherein the measuring step comprises feeding a plurality of discontinuous sense currents with different current values each other through said tunnel magnetoresistive effect element.

3. The method as claimed in claim 1, wherein the measuring step comprises measuring two resistances of said tunnel magnetoresistive effect element by feeding two sense currents with different current values each other through said tunnel magnetoresistive effect element, and wherein the calculating step comprises calculating a ratio of change in resistance based upon the measured two resistances of said tunnel magnetoresistive effect element.

4. A method for testing a tunnel magnetoresistive effect element comprising the steps of:
    measuring a first resistance of said tunnel magnetoresistive effect element by feeding a first sense current with a first current value through said tunnel magnetoresistive effect element, and a second resistance of said tunnel magnetoresistive effect element by feeding a second sense current with a second current value of which absolute value is greater than that of the first current value through said tunnel magnetoresistive effect element, said second sense current being discontinuous with said first sense current;
    calculating a ratio of change in resistance from the measured first and second resistances of said tunnel magnetoresistive effect element; and
    evaluating said tunnel magnetoresistive effect element using the calculated ratio of change in resistance.

5. The method as claimed in claim 4, wherein the measuring step comprises feeding a second sense current that is discontinuous to said first sense current through said tunnel magneto resistive effect element.

6. The method as claimed in claim 4, wherein the calculating step comprises calculating the ratio of change in resistance from a difference between said measured first and second resistances.

7. The method as claimed in claim 4, wherein the calculating step comprises calculating the ratio of change in resistance from an expression of $(R_2-R_1)/R_1 \times 100$ (%), where said first resistance is indicated by $R_1$ and said second resistance is indicated by $R_2$.

8. The method as claimed in claim 7, wherein the evaluating step comprises evaluating said tunnel magnetoresistive effect element as a non-defective product when the calculated ratio of change in resistance $(R_2-R_1)/R_1 \times 100$ (%) is less than a predetermined threshold.

9. The method as claimed in claim 8, wherein said tunnel magnetoresistive effect element has a tunnel barrier layer made of an oxide of aluminum, wherein the measuring step comprises feeding a first sense current of 0.1 mA through said tunnel magnetoresistive effect element, and feeding a second sense current of 0.4 mA through said tunnel magnetoresistive effect element, and wherein said predetermined threshold is −0.8 (%).

10. The method as claimed in claim 4, wherein the measuring step comprises applying an external DC magnetic field in a predetermined direction to said tunnel magnetoresistive effect element so that the measuring step is performed under the applied external DC magnetic field.

11. The method as claimed in claim 4, wherein said tunnel magnetoresistive effect element is a tunnel magnetoresistive effect head element.

12. The method as claimed in claim 4, wherein said tunnel magnetoresistive effect element is a magnetoresistive effect random access memory cell.

13. An apparatus for testing a tunnel magnetoresistive effect element comprising:
    means for measuring a first resistance of said tunnel magnetoresistive effect element by feeding a first sense current with a first current value through said tunnel magnetoresistive effect element, and a second resistance of said tunnel magnetoresistive effect element by feeding a second sense current with a second current value of which absolute value is greater than that of the first current value through said tunnel magnetoresistive effect element, said second send current being discontinuous with said first sense current;
    means for calculating a ratio of change in resistance from the measured first and second resistances of said tunnel magnetoresistive effect element; and
    means for evaluating said tunnel magnetoresistive effect element using the calculated ratio of change in resistance.

14. The apparatus as claimed in claim 13, wherein the measuring means comprises means for feeding a second sense current that is discontinuous to said first sense current through said tunnel magnetoresistive effect element.

15. The apparatus as claimed in claim 13, wherein the calculating means comprises means for calculating the ratio of change in resistance from a difference between said measured first and second resistances.

16. The apparatus as claimed in claim 13, wherein the calculating means comprises means for calculating the ratio of change in resistance from an expression of $(R_2-R_1)/R_1 \times 100$ (%), where said first resistance is indicated by $R_1$ and said second resistance is indicated by $R_2$.

17. The apparatus as claimed in claim 16, wherein the evaluating means comprises means for evaluating said tunnel magnetoresistive effect element as a non-defective product when the calculated ratio of change in resistance $(R_2-R_1)/R_1 \times 100$ (%) is less than a predetermined threshold.

18. The apparatus as claimed in claim 17, wherein said tunnel magnetoresistive effect element has a tunnel barrier layer made of an oxide of aluminum, wherein the measuring means comprises means for feeding a first sense current of 0.1 mA through said tunnel magnetoresistive effect element, and means for feeding a second sense current of 0.4 mA through said tunnel magnetoresistive effect element, and wherein said predetermined threshold is −0.8 (%).

19. The apparatus as claimed in claim 13, wherein the measuring means comprises means for applying an external DC magnetic field in a predetermined direction to said tunnel magnetoresistive effect element so that the measurement is performed under the applied external DC magnetic field.

20. The apparatus as claimed in claim 13, wherein said tunnel magnetoresistive effect element is a tunnel magnetoresistive effect head element.

21. The apparatus as claimed in claim 13, wherein said tunnel magnetoresistive effect element is a magnetoresistive effect random access memory cell.

22. A manufacturing method of a tunnel magnetoresistive effect element comprising:
a wafer process for forming many thin-film tunnel magnetoresistive effect elements on a wafer;
a cut process for cutting said wafer into a plurality of bar members, each of said bar members having the aligned tunnel magnetoresistive effect elements;
a measurement process for measuring a first resistance of the tunnel magnetoresistive effect element to be tested on said bar member by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;
a calculation process for calculating a ratio of change in resistance from the measured first and second resistances of said tunnel magnetoresistive effect element;
an evaluation process for evaluating said tunnel magnetoresistive effect element using the calculated ratio of change in resistance
a separation process for cutting the evaluated bar member into individual magnetic head sliders, each of said individual magnetic head slider having said tunnel magnetoresistive effect element.

23. The manufacturing method as claimed in claim 22, wherein the measurement process comprises feeding a second sense current that is discontinuous to said first sense current through said tunnel magnetoresistive effect element.

24. The manufacturing method as claimed in claim 22, wherein the calculation process comprises calculating the ratio of change in resistance from a difference between said measured first and second resistances.

25. The manufacturing method as claimed in claim 22, wherein the calculation process comprises calculating the ratio of change in resistance from an expression of $(R_2-R_1)/R_1 \times 100$ (%), where said first resistance is indicated by $R_1$ and said second resistance is indicated by $R_2$.

26. The manufacturing method as claimed in claim 25, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

27. The manufacturing method as claimed in claim 26, wherein said tunnel magnetoresistive effect element has a tunnel barrier layer made of an oxide of aluminum, wherein the measurement process comprises feeding a first sense current of 0.1 mA through said tunnel magnetoresistive effect element, and feeding a second sense current of 0.4 mA through said tunnel magnetoresistive effect element, and wherein said predetermined threshold is −0.8 (%).

28. The manufacturing method as claimed in claim 22, wherein the measurement process comprises applying an external DC magnetic field in a predetermined direction to said tunnel magnetoresistive effect element so that the measurement process is performed under the applied external DC magnetic field.

29. The manufacturing method as claimed in claim 22, wherein said tunnel magnetoresistive effect element is a tunnel magnetoresistive effect head element.

30. The manufacturing method as claimed in claim 22, wherein said tunnel magnetoresistive effect element is a magnetoresistive effect random access memory cell.

31. A manufacturing method of a tunnel magneto resistive effect element comprising:
a wafer process for forming many thin-film tunnel magnetoresistive effect elements on a wafer;
a measurement process for measuring a first resistance of the tunnel magneto resistive effect element to be tested on said wafer by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;
a calculation process for calculating a ratio of change in resistance from the measured first and second resistances of said tunnel magnetoresistive effect element;
an evaluation process for evaluating said tunnel magnetoresistive effect element using the calculated ratio of change in resistance;
a cut process for cutting the evaluated wafer into a plurality of bar members, each of said bar members having the aligned tunnel magnetoresistive effect elements; and
a separation process for cutting each bar member into individual magnetic head sliders, each of said individual magnetic head slider having said tunnel magnetoresistive effect element.

32. The manufacturing method as claimed in claim 31, wherein the measurement process comprises feeding a second sense current that is discontinuous to said first sense current through said tunnel magnetoresistive effect element.

33. The manufacturing method as claimed in claim 31, wherein the calculation process comprises calculating the ratio of change in resistance from a difference between said measured first and second resistances.

34. The manufacturing method as claimed in claim 31, wherein the calculation process comprises calculating the ratio of change in resistance from an expression of $(R_2-R_1)/R_1 \times 100$ (%), where said first resistance is indicated by $R_1$ and said second resistance is indicated by $R_2$.

35. The manufacturing method as claimed in claim 34, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

36. The manufacturing method as claimed in claim 35, wherein said tunnel magnetoresistive effect element has a tunnel barrier layer made of an oxide of aluminum, wherein the measurement process comprises feeding a first sense current of 0.1 mA through said tunnel magnetoresistive effect element, and feeding a second sense current of 0.4 mA through said tunnel magnetoresistive effect element, and wherein said predetermined threshold is −0.8 (%).

37. The manufacturing method as claimed in claim 31, wherein the measurement process comprises applying an external DC magnetic field in a predetermined direction to said tunnel magnetoresistive effect element so that the measurement process is performed under the applied external DC magnetic field.

38. The manufacturing method as claimed in claim 31, wherein said tunnel magnetoresistive effect element is a tunnel magnetoresistive effect head element.

39. The manufacturing method as claimed in claim 31, wherein said tunnel magnetoresistive effect element is a magnetoresistive effect random access memory cell.

40. A manufacturing method of a tunnel magnetoresistive effect element comprising:
- a wafer process for forming many thin-film tunnel magnetoresistive effect elements on a wafer;
- a cut process for cutting said wafer into a plurality of bar members, each of said bar members having the aligned tunnel magnetoresistive effect elements;
- a separation process for cutting each of said bar members into individual magnetic head sliders, each of said individual magnetic head slider having said tunnel magnetoresistive effect element;
- a measurement process for measuring a first resistance of the tunnel magnetoresistive effect element to be tested by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;
- a calculation process for calculating a ratio of change in resistance from the measured first and second resistances of said tunnel magnetoresistive effect element; and
- an evaluation process for evaluating said tunnel magnetoresistive effect element using the calculated ratio of change in resistance.

41. The manufacturing method as claimed in claim 40, wherein the measurement process comprises feeding a second sense current that is discontinuous to said first sense current through said tunnel magnetoresistive effect element.

42. The manufacturing method as claimed in claim 40, wherein the calculation process comprises calculating the ratio of change in resistance from a difference between said measured first and second resistances.

43. The manufacturing method as claimed in claim 40, wherein the calculation process comprises calculating the ratio of change in resistance from an expression of $(R_2-R_1)/R_1 \times 100$ (%), where said first resistance is indicated by $R_1$ and said second resistance is indicated by $R_2$.

44. The manufacturing method as claimed in claim 43, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

45. The manufacturing method as claimed in claim 44, wherein said tunnel magnetoresistive effect element has a tunnel barrier layer made of an oxide of aluminum, wherein the measurement process comprises feeding a first sense current of 0.1 mA through said tunnel magneto resistive effect element, and feeding a second sense current of 0.4 mA through said tunnel magneto resistive effect element, and wherein said predetermined threshold is −0.8 (%).

46. The manufacturing method as claimed in claim 40, wherein the measurement process comprises applying an external DC magnetic field in a predetermined direction to said tunnel magneto resistive effect element so that the measurement process is performed under the applied external DC magnetic field.

47. The manufacturing method as claimed in claim 40, wherein said tunnel magnetoresistive effect element is a tunnel magnetoresistive effect head element.

48. The manufacturing method as claimed in claim 40, wherein said tunnel magneto resistive effect element is a magnetoresistive effect random access memory cell.

49. A tunnel magnetoresistive effect element manufactured by a method of a comprising:
- a wafer process for forming many thin-film tunnel magnetoresistive effect elements on a wafer;
- a cut process for cutting said wafer into a plurality of bar members, each of said bar members having the aligned tunnel magnetoresistive effect elements;
- a measurement process for measuring a first resistance of the tunnel magnetoresistive effect element to be tested on said bar member by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;
- a calculation process for calculating a ratio of change in resistance from the measured first and second resistances of said tunnel magnetoresistive effect element;
- an evaluation process for evaluating said tunnel magnetoresistive effect element using the calculated ratio of change in resistance; and
- a separation process for cutting the evaluated bar member into individual magnetic head sliders, each of said individual magnetic head slider having said tunnel magnetoresistive effect element.

50. The tunnel magnetoresistive effect element as claimed in claim 49, wherein said tunnel magnetoresistive effect element has a tunnel barrier layer made of an oxide of aluminum.

51. A tunnel magnetoresistive effect element manufactured by a method of a comprising:
- a wafer process for forming many thin-film tunnel magnetoresistive effect elements on a wafer;
- a measurement process for measuring a first resistance of the tunnel magnetoresistive effect element to be tested on said wafer by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;

a calculation process for calculating a ratio of change in resistance from the measured first and second resistances of said tunnel magnetoresistive effect element;

an evaluation process for evaluating said tunnel magnetoresistive effect element using the calculated ratio of change in resistance;

a cut process for cutting the evaluated wafer into a plurality of bar members, each of said bar members having the aligned tunnel magnetoresistive effect elements; and a separation process for cutting each bar member into individual magnetic head sliders, each of said individual magnetic head slider having said tunnel magnetoresistive effect element.

52. The tunnel magnetoresistive effect element as claimed in claim 51, wherein said tunnel magnetoresistive effect element has a tunnel barrier layer made of an oxide of aluminum.

53. A tunnel magnetoresistive effect element manufactured by a method of a comprising:

a wafer process for forming many thin-film tunnel magneto resistive effect elements on a wafer;

a cut process for cutting said wafer into a plurality of bar members, each of said bar members having the aligned tunnel magnetoresistive effect elements;

a separation process for cutting each of said bar members into individual magnetic head sliders, each of said individual magnetic head slider having said tunnel magnetoresistive effect element;

a measurement process for measuring a first resistance of the tunnel magnetoresistive effect element to be tested by feeding a first sense current with a first current value through said tunnel magnetoresistive effect element, and measuring a second resistance of said tunnel magnetoresistive effect element by feeding a second sense current with a second current value of which absolute value is greater than that of the first current value through said tunnel magnetoresistive effect element, said second sense current being discontinuous with said first sense current;

a calculation process for calculating a ratio of change in resistance from the measured first and second resistances of said tunnel magnetoresistive effect element an evaluation process for evaluating said tunnel magnetoresistive effect element using the calculated ratio of change in resistance.

54. The tunnel magnetoresistive effect element as claimed in claim 53, wherein said tunnel magnetoresistive effect element has a tunnel barrier layer made of an oxide of aluminum.

* * * * *